US008785987B2

United States Patent
Masliah

(10) Patent No.: US 8,785,987 B2
(45) Date of Patent: *Jul. 22, 2014

(54) IGFET DEVICE HAVING AN RF CAPABILITY

(75) Inventor: Denis Masliah, Saint Germain en Laye (FR)

(73) Assignee: Acco, Saint-Germain-en-Laye (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/189,342

(22) Filed: Jul. 22, 2011

(65) Prior Publication Data

US 2011/0278675 A1    Nov. 17, 2011

Related U.S. Application Data

(63) Continuation of application No. 12/089,711, filed as application No. PCT/IB2005/003029 on Oct. 12, 2005, now Pat. No. 8,008,731.

(51) Int. Cl.

| H01L 29/82 | (2006.01) |
|---|---|
| H01L 29/40 | (2006.01) |
| H01L 29/423 | (2006.01) |
| H01L 29/66 | (2006.01) |
| H01L 29/78 | (2006.01) |
| H01L 27/06 | (2006.01) |

(52) U.S. Cl.
CPC ....... *H01L 29/66659* (2013.01); *H01L 29/7831* (2013.01); *H01L 29/402* (2013.01); *H01L 29/42376* (2013.01); *H01L 29/7817* (2013.01); *H01L 29/42372* (2013.01); *H01L 29/7835* (2013.01); *H01L 29/78* (2013.01); *H01L 27/0629* (2013.01)
USPC ........... 257/262; 257/213; 257/256; 257/261; 257/271; 257/274; 257/288; 257/368; 257/E21.444; 257/E21.417

(58) Field of Classification Search
CPC .................. H01L 29/42372; H01L 29/66659; H01L 29/7831; H01L 23/5223; H01L 27/0805; H01L 27/0629
USPC ......... 257/213, 256, 261, 262, 271, 274, 288, 257/335, 366, 368, 381–397, E21.417, 257/E29.255, E29.256; 438/294
See application file for complete search history.

(56) References Cited

U.S. PATENT DOCUMENTS

| 4,228,367 A | 10/1980 | Brown |
|---|---|---|
| 4,255,714 A | 3/1981 | Rosen |

(Continued)

FOREIGN PATENT DOCUMENTS

| EP | 2006009009 | 1/1996 |
|---|---|---|
| GB | 2336485 A | 10/1999 |

(Continued)

OTHER PUBLICATIONS

EP 05791809.6 Communication pursuant to Article 94(3) EPC, mailed Feb. 15, 2013.

(Continued)

*Primary Examiner* — Samuel Gebremariam
(74) *Attorney, Agent, or Firm* — Peters Verny, LLP

(57) ABSTRACT

An IGFET device includes: —a semiconductor body having a major surface, —a source region of first conductivity type abutting the surface, —a drain region of the first conductivity-type abutting the surface and spaced from the source region with a channel therefrom, —an active gate overlying the channel and insulated from the channel by a first dielectric material forming the gate oxide of the IGFET device, —a dummy gate positioned between the active gate and the drain and insulated from the active gate by a second dielectric material so that a capacitance is formed between the active gate and the dummy gate, and insulated from the drain region by the gate oxide, wherein the active gate and the dummy gate are forming the electrodes of the capacitance substantially perpendicular to the surface.

7 Claims, 7 Drawing Sheets

(56) References Cited

U.S. PATENT DOCUMENTS

| | | | |
|---|---|---|---|
| 4,353,036 A | 10/1982 | Hoover | |
| 4,523,111 A | 6/1985 | Baliga | |
| 4,811,075 A | 3/1989 | Eklund | |
| 4,841,466 A | 6/1989 | Christopher | |
| 5,061,903 A | 10/1991 | Vasile | |
| 5,126,807 A | 6/1992 | Baba et al. | |
| 5,296,400 A * | 3/1994 | Park et al. | 438/253 |
| 5,537,078 A | 7/1996 | Strong | |
| 5,543,643 A | 8/1996 | Kapoor | |
| 5,559,049 A | 9/1996 | Cho | |
| 5,677,927 A | 10/1997 | Fullerton et al. | |
| 5,898,198 A | 4/1999 | Herbert et al. | |
| 5,912,490 A | 6/1999 | Hebert et al. | |
| 5,969,582 A | 10/1999 | Boesch et al. | |
| 6,061,008 A | 5/2000 | Abbey | |
| 6,061,555 A | 5/2000 | Bultman et al. | |
| 6,081,159 A | 6/2000 | Kim et al. | |
| 6,088,484 A | 7/2000 | Mead | |
| 6,222,764 B1 | 4/2001 | Kelley et al. | |
| 6,242,978 B1 | 6/2001 | Danielsons | |
| 6,275,177 B1 | 8/2001 | Ho et al. | |
| 6,300,835 B1 | 10/2001 | Seely et al. | |
| 6,304,608 B1 | 10/2001 | Chen et al. | |
| 6,384,688 B1 | 5/2002 | Fujioka et al. | |
| 6,414,545 B1 | 7/2002 | Zhang | |
| 6,503,782 B2 | 1/2003 | Casady et al. | |
| 6,535,050 B2 | 3/2003 | Baudelot et al. | |
| 6,570,518 B2 | 5/2003 | Riley et al. | |
| 6,600,369 B2 | 7/2003 | Mitzlaff | |
| 6,614,281 B1 | 9/2003 | Baudelot et al. | |
| 6,633,195 B2 | 10/2003 | Baudelot et al. | |
| 6,703,684 B2 | 3/2004 | Udrea et al. | |
| 6,784,470 B2 | 8/2004 | Davis | |
| 6,967,608 B1 | 11/2005 | Maloberti et al. | |
| 7,049,669 B2 | 5/2006 | Ma et al. | |
| 7,162,042 B2 | 1/2007 | Spencer et al. | |
| 7,259,621 B2 | 8/2007 | Kusunoki et al. | |
| 7,312,481 B2 | 12/2007 | Chen et al. | |
| 7,348,826 B1 | 3/2008 | Klein et al. | |
| 7,378,912 B2 | 5/2008 | Tanahashi et al. | |
| 7,522,079 B1 | 4/2009 | Wu | |
| 7,554,397 B2 | 6/2009 | Vitzilaios et al. | |
| 7,656,229 B2 | 2/2010 | Deng et al. | |
| 7,679,448 B1 | 3/2010 | McAdam et al. | |
| 7,808,415 B1 | 10/2010 | Robbe et al. | |
| 7,863,645 B2 | 1/2011 | Masliah et al. | |
| 7,952,431 B2 | 5/2011 | Quack et al. | |
| 7,969,243 B2 | 6/2011 | Bracale et al. | |
| 7,969,341 B2 | 6/2011 | Robbe et al. | |
| 8,008,731 B2 * | 8/2011 | Masliah | 257/386 |
| 8,159,298 B2 | 4/2012 | Quack et al. | |
| 8,179,197 B2 | 5/2012 | Bracale et al. | |
| 8,188,540 B2 | 5/2012 | Masliah et al. | |
| 8,334,178 B2 | 12/2012 | Masliah et al. | |
| 2001/0024138 A1 | 9/2001 | Dohnke et al. | |
| 2002/0058410 A1 | 5/2002 | Sung et al. | |
| 2002/0093442 A1 | 7/2002 | Gupta | |
| 2002/0094795 A1 | 7/2002 | Mitzlaff | |
| 2002/0105360 A1 | 8/2002 | Kim et al. | |
| 2002/0113650 A1 | 8/2002 | Kim et al. | |
| 2002/0145170 A1 | 10/2002 | Murakami | |
| 2003/0073269 A1 * | 4/2003 | Tran | 438/183 |
| 2004/0248529 A1 | 12/2004 | Park | |
| 2005/0007200 A1 | 1/2005 | Inoue et al. | |
| 2005/0017298 A1 | 1/2005 | Xie et al. | |
| 2005/0212583 A1 | 9/2005 | Pai | |
| 2005/0285189 A1 * | 12/2005 | Shibib et al. | 257/341 |
| 2005/0287966 A1 | 12/2005 | Yoshimi et al. | |
| 2006/0228850 A1 | 10/2006 | Tsai et al. | |
| 2007/0018865 A1 | 1/2007 | Chang et al. | |
| 2007/0178856 A1 | 8/2007 | Mitzlaff et al. | |
| 2007/0182485 A1 | 8/2007 | Ko | |
| 2008/0031382 A1 | 2/2008 | Aoki | |
| 2008/0079499 A1 | 4/2008 | Tsai | |
| 2008/0291069 A1 | 11/2008 | Inukai et al. | |
| 2008/0297386 A1 | 12/2008 | Maloberti et al. | |
| 2009/0066549 A1 | 3/2009 | Thomsen et al. | |
| 2009/0286492 A1 | 11/2009 | Mallet-Guy et al. | |
| 2010/0026393 A1 | 2/2010 | Keerti et al. | |

FOREIGN PATENT DOCUMENTS

| | | |
|---|---|---|
| IL | 125022 | 9/2001 |
| JP | 56165350 A | 5/1980 |
| JP | 03-099466 | 4/1991 |
| JP | 10107214 A | 4/1998 |
| WO | 9956311 | 11/1999 |
| WO | 0139451 | 5/2001 |
| WO | 2006054148 | 5/2006 |
| WO | 2007042850 | 4/2007 |
| WO | 2007075759 A2 | 7/2007 |
| WO | 2008037650 A1 | 4/2008 |

OTHER PUBLICATIONS

EP 12179276.6 Extended European Search Report, mailed Feb. 15, 2013.

Jackel, L.D., et al., "CASFET: A MOSFET-JFET Cascode Device with Ultralow Gate Capacitance" IEEE Transactions on electron Devices, IEEE Service Center, Piscataway, NJ, US col. ED-31, No. 12, Dec. 1984.

EP 12179276.6 Applicants Response to the Extended European Search Report, submitted Jul. 10, 2013.

U.S. Appl. No. 13/088,684, Sylvain Quack, Linearization Circuits and Methods for Power Amplification, filed Apr. 18, 2011.

U.S. Appl. No. 12/951,958, Denis Masliah, High Breakdown Voltage Double-Gate Semiconductor Device, filed Nov. 22, 2010.

U.S. Appl. No. 12/951,972, Denis Masliah, High Breakdown Voltage Double-Gate Semiconductor Device, filed Nov. 22, 2010.

U.S. Appl. No. 12/771,339, Denis Masliah, RF Switches, filed Apr. 30, 2010.

U.S. Appl. No. 13/107,411, Alexandre G. Bracale, Electronic circuits including a MOSFET and a dual-gate JFET, filed May 13, 2011.

EP 05791809.6 Communication pursuant to Article 94(3) EPC, mailed Sep. 25, 2013.

EP 05791809.6 Applicants Response to Article 94(3) EPC Communication, filed Apr. 16, 2013.

EP12179276.6 Communication pursuant to Article 94(3) EPC, mailed Sep. 25, 2013.

EP12179276.6 Applicant's Response to Article 94(3) EPC Communication, filed Jan. 15, 2014.

Jacket, Lawrence D., et al., "CASFET: A MOSFET-JFET Cascode Device with Ultralow Gate Capacitance," IEEE Transactions on Electron Devices, IEEE SErvice Center, Piscataway, NJ, vol. ED-31, No. 12, Dec. 1, 1984, pp. 1752-1754.

Temes, G. C., et al., "Delta Sigma Data Converters, Architectures for .delta.epsilon.DACs" Jan. 1, 1997, Delta-Sigma Data Converters, Theory, Design, and Simulation, New York, NY: IEEE, US, ISBN: 978-0-7803-1045-2, Ch. 10.

Gautier, D., et al., "Improved Delta Sigma Modulators for High Speed Applications," Acco Semiconductors, Mar. 25, 2009.

Azakkour, A. et al., "Challenges for a new integrated Ultra-wideband (UWB) source," IEEE, 2003 pp. 433-437.

Azakkour, A. et al., "A new integrated moncycle generator and transmitter for Ultra-wideband (UWB) communications," IEEE Radio Frequency Circuits Symposium, 2005 pp. 79-82.

Choi, Y. H. et al., "Gated UWB Pulse Signal Generation," IEEE, 2004 pp. 122-124.

PCT/US2008/001938 Int'l Search Report and Written Opinion, Jun. 26, 2008.

PCT/IB05/003426 Int'l Search Report, Mar. 20, 2006.

PCT/IB05/003426 Written Opinion, May 16, 2007.

PCT/IB05/003029 Int'l Search Report, Jul. 6, 2006.

PCT/IB05/003029 Written Opinion, Mar. 12, 2008.

PCT/US10/27921 Int'l Search Report and Written Opinion, May 10, 2010.

PCT/US10/30770 Int'l Search Report and Written Opinion, Jun. 16, 2010.

(56) References Cited

OTHER PUBLICATIONS

PCT/US10/041985 Int'l Search Report and Written Opinion, Sep. 9, 2010.
PCT/US11/32488 Int'l Search Report and Written Opinion, Jun. 28, 2011.
Vaes, H. M. J. et al., "High Voltage, High Current Lateral Devices," IEDM Technical Digest, 1988, pp. 87-90.
Pocha, Michael D. et al. "Threshold Voltage Controllability in Double-Diffused MOS Transistors," IEEE Transactions on Electronic Devices, vol. ED-21, No. 12, Dec. 1994.
EP 05791809.6 Communication pursuant to Article 94(3) EPC, mailed Aug. 17, 2010.
EP 05791809.6 Applicant's Response to Article 94(3) EPC Communication, filed Feb. 23, 2011.

* cited by examiner

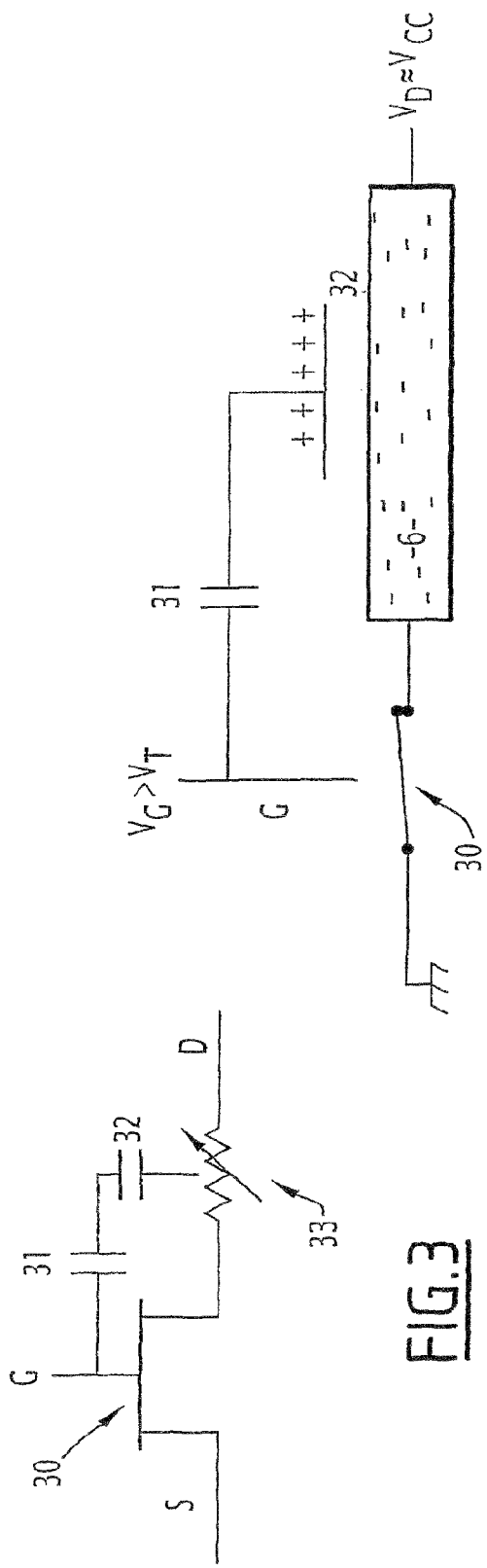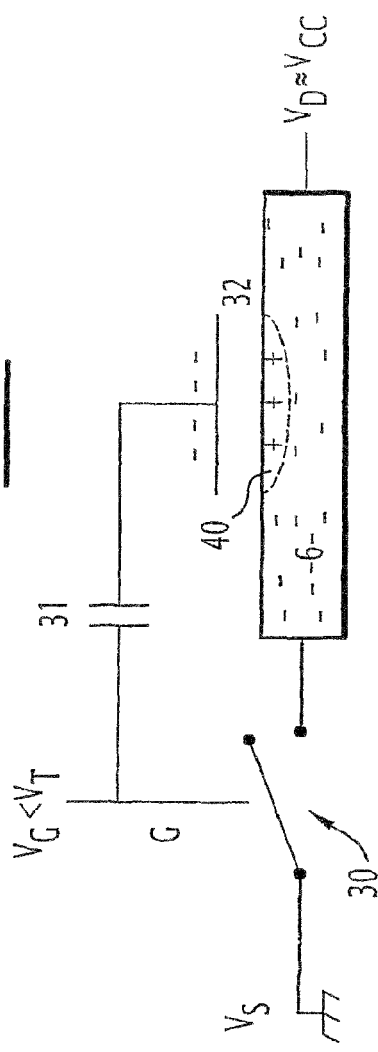

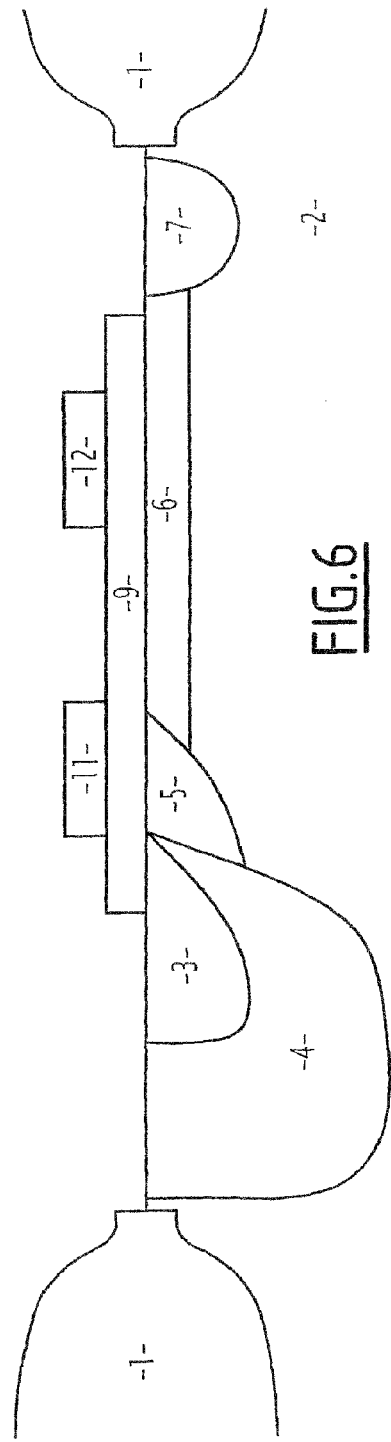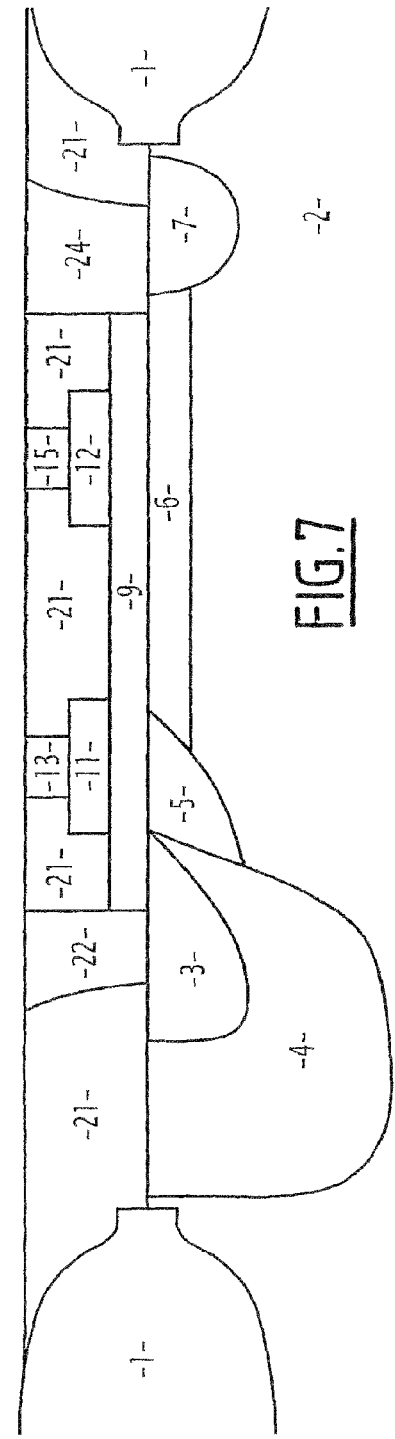

IGFET DEVICE HAVING AN RF CAPABILITY

CROSS-REFERENCE TO RELATED APPLICATIONS

This application is a continuation of U.S. patent application Ser. No. 12/089,711, filed Apr. 10, 2008 now U.S. Pat. No. 8,008,731 entitled "IGFET Device Having a RF Capability," which is a National Stage Application with a 371(c) date of Apr. 10, 2008 claiming priority of PCT/IB2005/003029 with an International Filing Date of Oct. 12, 2005.

BACKGROUND OF THE INVENTION

1. Field of the Invention

This invention relates generally to insulated gate field-effect transistors (IGFETs).

2. Description of the Prior Art

Herbert et al., U.S. Pat. No. 5,912,490, discloses a FET structure having a reduced drain to gate capacitance by providing a buried shield plate underlying the gate and between the gate and drain of the transistor. Use of a buried shield between the gate and drain of a field effect transistor can reduce gate to drain capacitance and maximizes the frequency response of the IGFETs.

As a result of this improvement in frequency response, the breakdown voltage of drain to substrate is lowered.

It appears that a compromise needs to be made between the reduction of gate to drain capacitance to increase the frequency response and the breakdown voltage of drain to substrate.

The goal of the invention is directed to a MOSFET structure having higher operation voltage and higher breakdown capability, while keeping a high frequency behaviour and a high density.

SUMMARY

In accordance with the invention, an IGFET device comprises: a semiconductor body having a major surface, a source region of first conductivity type abutting said surface, a drain region of said first conductivity-type abutting said surface and spaced from said source region with a channel therefrom, an active gate overlying said channel and insulated from the channel by a first dielectric material forming the gate oxide of the IGFET device, a dummy gate is positioned between said active gate and said drain and is insulated from the active gate by a second dielectric material so that a capacitance is formed between the active gate and the dummy gate, and is insulated from the drain region by said gate oxide, wherein the active gate and the dummy gate are forming the electrodes of said capacitance substantially perpendicular to said surface.

According to an aspect of the invention, the dummy gate and the active gate comprise a stack of multiple metal layers in parallel forming electrode of said capacitance.

Pursuant of another aspect of the invention said stack is connected to a polysilicon layer and the stack can be disposed on top of the polysilicon layer.

Advantageously, the invention can be applied to MOSFET and LDMOS transistors.

BRIEF DESCRIPTION OF DRAWINGS

FIG. 3 is the equivalent electrical circuit of the LDMOS of FIG. 1,

FIGS. 4 and 5 are the equivalent electrical circuits of the LDMOS of FIG. 1 in two different modes of conduction;

FIGS. 6 to 9 are the section view of the LDMOS of FIG. 1 during different steps of processing;

DETAILED DESCRIPTION

Figure 1:
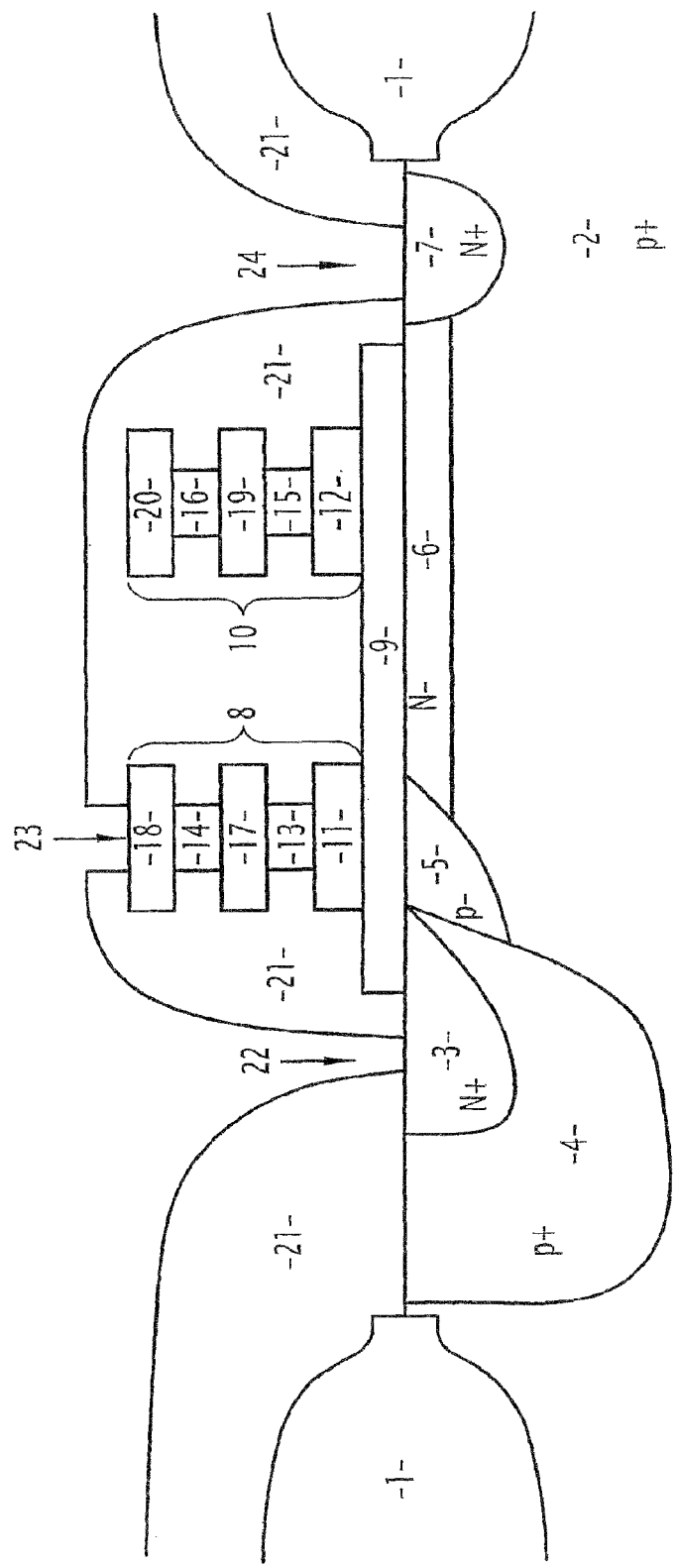
FIG. 1 is a section view of a LDMOS in accordance with an embodiment of the invention.

The FIG. 1 is a section view of a lateral double-diffused field effect transistor, or LDMOS, in accordance with one embodiment of the invention. Field oxide 1 defines a device region in the surface of a $P^+$ substrate 2. A $N^+$ source region 3 is formed in a $P^+$ base region 4 by double-diffusion processing with base region 4 having a $P^-$ doped extension 5 which defines a channel region of the transistor. $N^-$ doped region 6 and $N^+$ doped region 7 define the drain of the transistor. An active gate 8 is formed over channel 5 with a gate oxide 9 electrically separating the active gate 8 from channel 5 and substrate 2.

In accordance with the invention, a dummy gate 10 is provided between active gate 8 and the $N^+$ doped region 7 of the drain, on top of the $N^-$ region 6. The gate oxide 9 is electrically isolating the dummy gate 10 from the $N^-$ region 6.

The active gate 8 and the dummy gate 10 are composed of a stack having a first layer of polysilicon 11, 12. On top of this polysilicon layer, metal contacts 13, 14, 15, 16 and metal layers 17, 18, 19, 20 are alternatively disposed.

Dielectric material 21 (e.g., silicon-nitride) is provided on the surface of the device with openings there through for forming a source contact 22, a gate contact 23 and a drain contact 24.

Figure 2:
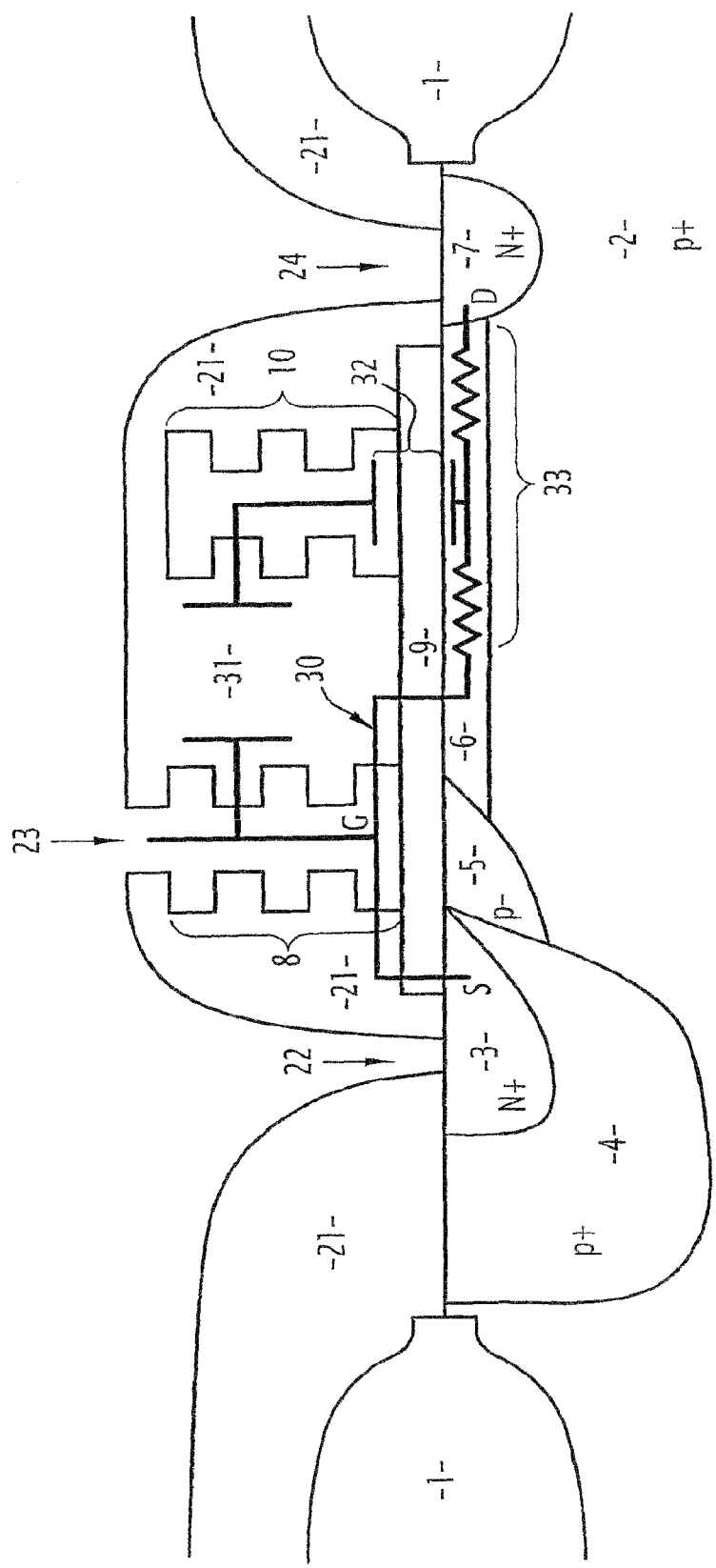
FIG. 2 is the equivalent electrical circuit of the LDMOS of FIG. 1.

Superimposed on the section view of the structure, the equivalent electrical circuit is represented in FIG. 2. The equivalent electrical circuit of this structure is composed of the transistor 30 with its source S, gate G and drain D. By providing the dummy gate 10 between the active gate 8 and the $N^+$ doped region 7 of the drain, i.e. on top of the drain region 6, the dummy gate 10 and the active gate 8 form a capacitance 31. Therefore, the dummy gate 10 is being electrically connected to the active gate 8 through this capacitance 31. The dummy gate 10 and the $N^-$ region 6 are forming a second capacitance 32 with the gate oxide 9 forming the dielectric part of the capacitance 32.

The $N^-$ region 6 is equivalent, FIG. 2 or 3, to a variable resistor 33 controlled by the capacitance 32 as it is explained below.

In an IGFET, the electrical conduction is normally from drain to source, in a conduction direction which is transverse to the direction of elongation of the gate conductor 8. Therefore, in a LDMOS such as the one described here, the source voltage is always at the lowest voltage, generally at GROUND level and the drain voltage is, in DC mode, at the supply voltage $V_{cc}$.

In a static view of operation of this transistor, two modes can be distinguished: a first mode where the voltage $V_G$ applied to the active gate 8 is higher than the threshold voltage $V_T$ of the transistor and a second mode where the voltage $V_G$ applied to the active gate 8 is below this threshold voltage $V_T$.

In the first mode, FIG. 4, the channel region is electrically conducting. Due to the capacitive coupling between the capacitors 31 and 32, the voltage applied to the $N^-$ region 6 by the dummy gate 10 is of the same order of magnitude as the drain voltage $V_d$. Therefore, the dummy gate 10 has almost no effect on the electrical conduction of the $N^-$ region 6.

In the second mode, FIG. 5, the channel region 5 is electrically open. The voltage applied to the N⁻ region 6 by the dummy gate 10 is roughly at GROUND level and substantially different to the drain voltage $V_d$. This voltage difference induces an increase of the depleted area 40 of the N⁻ region 6. Consequently the electrical sectional area of this N⁻ region 6, in which conduction takes place, is reduced and the resistance is increased.

Advantageously, the resistance of the N⁻ region 6 is varying with the gate voltage: the resistance is low when the gate voltage $V_g$ is above the threshold voltage $V_t$ and the transistor is conducting and the resistance is high when the gate voltage $V_g$ is below the threshold voltage $V_t$ and the transistor is open.

A classical LDMOS structure is described, for instance, in M. D. Pocha, A. G. Gonzales, and R. W. Dutton, IEEE Trans. on Electron Devices, ED-21, 778 (1974). Compared to this structure, the variable resistance of the above described transistor boasts high-frequency operation as the transistor has a low resistance between drain and source when it is conducting. At the same time, the transistor has a high drain-breakdown voltage as the resistance is high when the transistor is open.

Fabrication of the device of FIG. 1 requires no complex or costly processing and is based on standard MOSFET technology.

The FIG. 6 is a section view of the device with the basic transistor structures already implemented. Conventional polysilicon fabrication processes are used to obtain this structure.

The first layer 12 of the dummy gate and first layer 11 of the active gate are made simultaneously of polysilicon.

The FIG. 7 is a section view of the device at the next step of the manufacturing process. Metal contacts 13,15 are formed on top of the layers 11, 12 after the deposition and planarization of a dielectric material 21.

Figure 8:
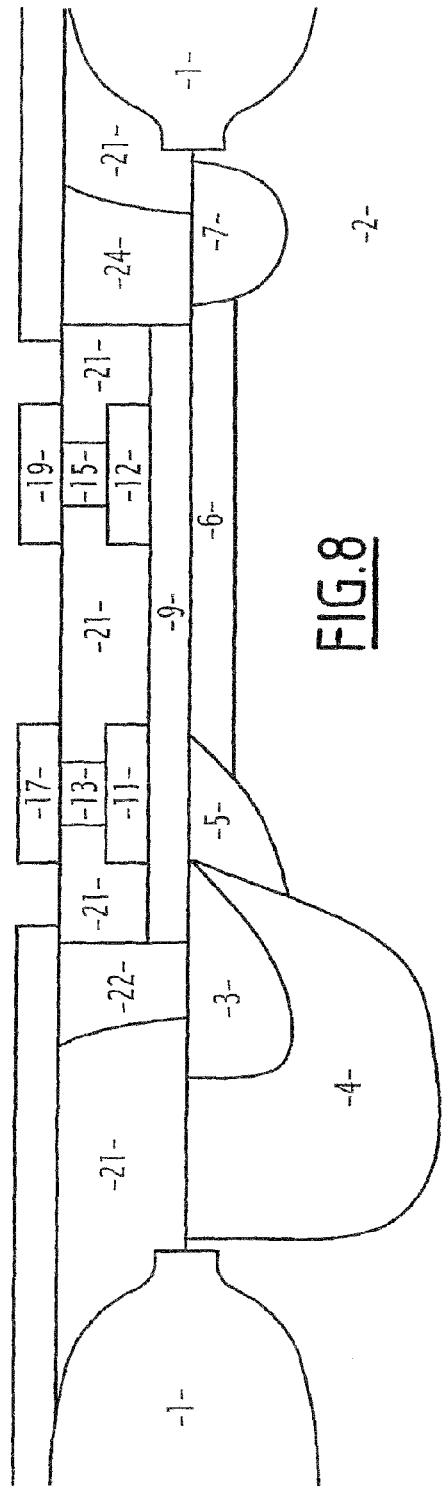

Then a metal layer is deposited and etched, FIG. 8, to form the first level of metal interconnection as well as a first metal stack 17, 19 on the metal contacts 13, 15.

Figure 9:
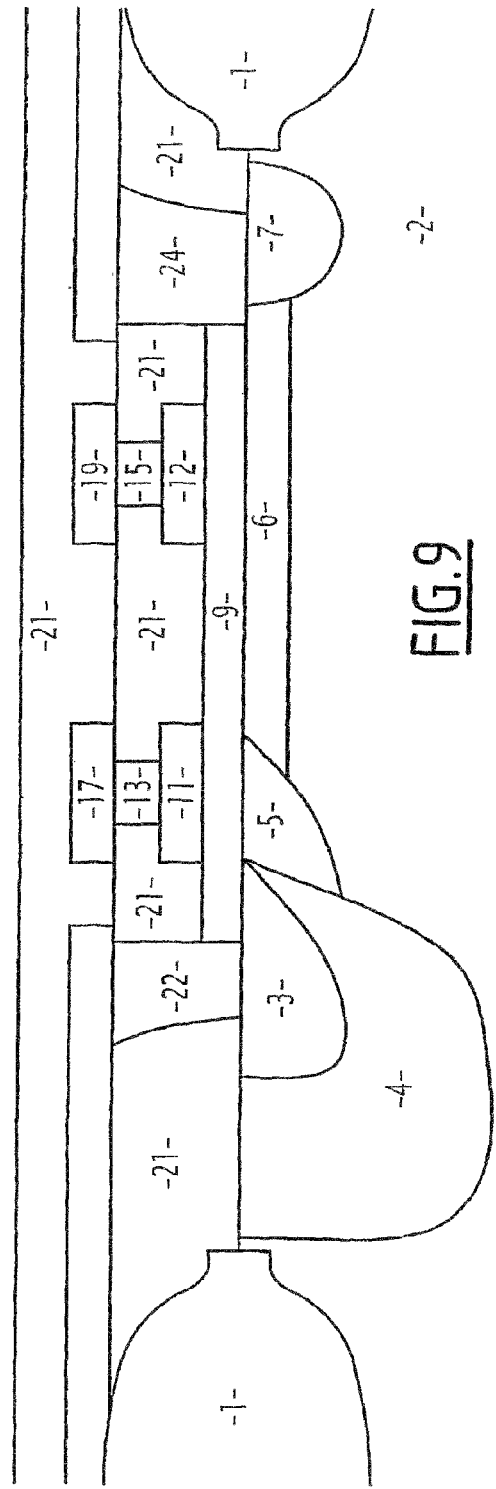

A dielectric material 21 is deposited, FIG. 9, and planarized to protect the underlying structure and prepare the structure to receive a new metal interconnection level.

Depending on the technology used, more than 2 metal interconnection layers are commonly manufactured.

From the description here above, the person skilled in the art understands that any standard MOS technology with two or more conductive interconnection layers such as aluminum, copper or polysilicon layers and the like, can be used to implement the invention.

The choice of technology defines the number of metal layers which can be stacked as well as the distance between the layers of the active gate and the layers of the dummy gate. These two parameters and the characteristics of the dielectric material define the value of the capacitance formed by the active gate and the dummy gate and, consequently, the behavior of the transistor.

For instance, a 0.18 μm technology sees an improvement of the breakdown capability in RF from 7 Volts to over 12 Volts. For a 0.13 μm, an improvement is from 3 or 4 Volts to 8 Volts.

The description of this embodiment of the invention is based on a LDMOS transistor. However, the invention is not limited to this type of Field-Effect transistors but is useful in all types of IGFET.

Figure 10:
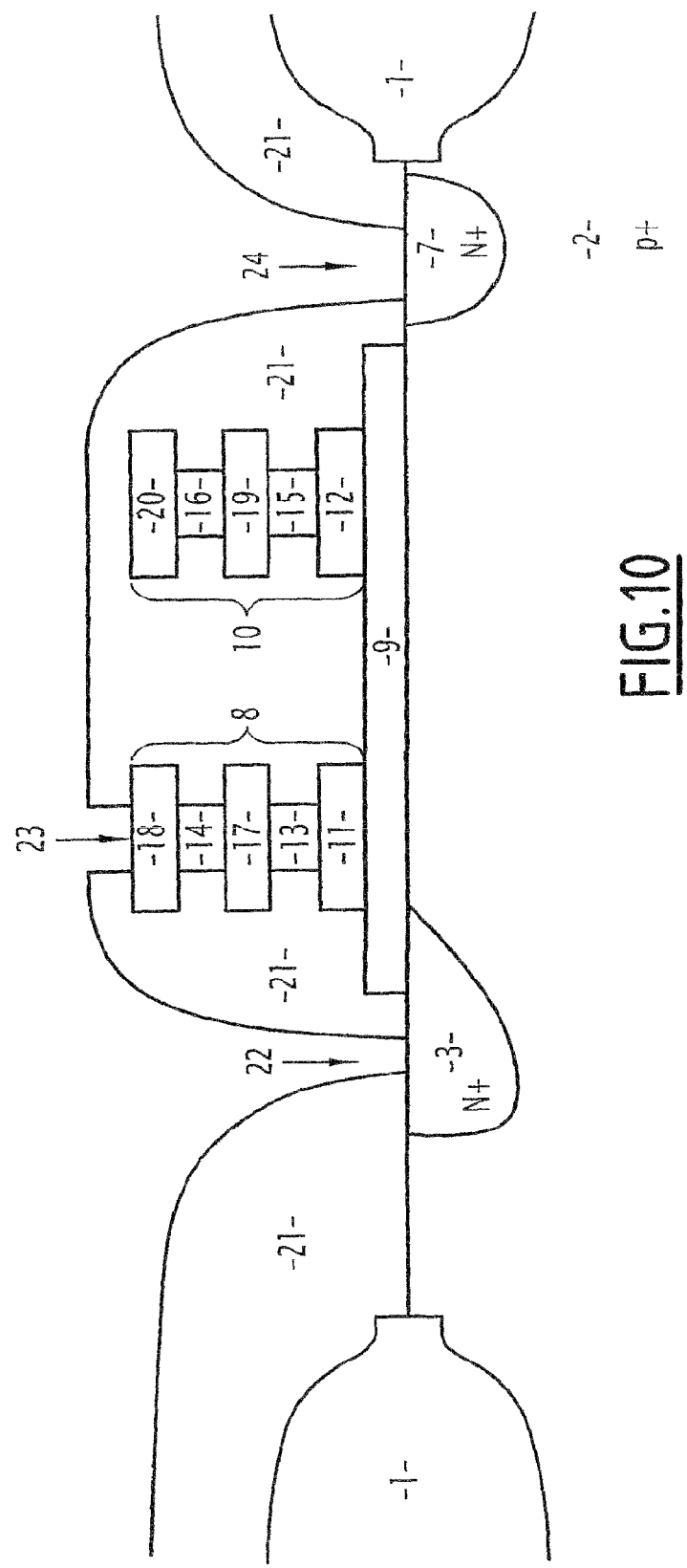
FIG. 10 is the section view of a MOS in accordance with another embodiment of the invention.

For instance, another embodiment of this invention is illustrated in FIG. 10 with a MOSFET in which the dummy gate 10 is implemented along the drain region 7, where the N-region is realized with the Nwell implantation.

Figure 11:
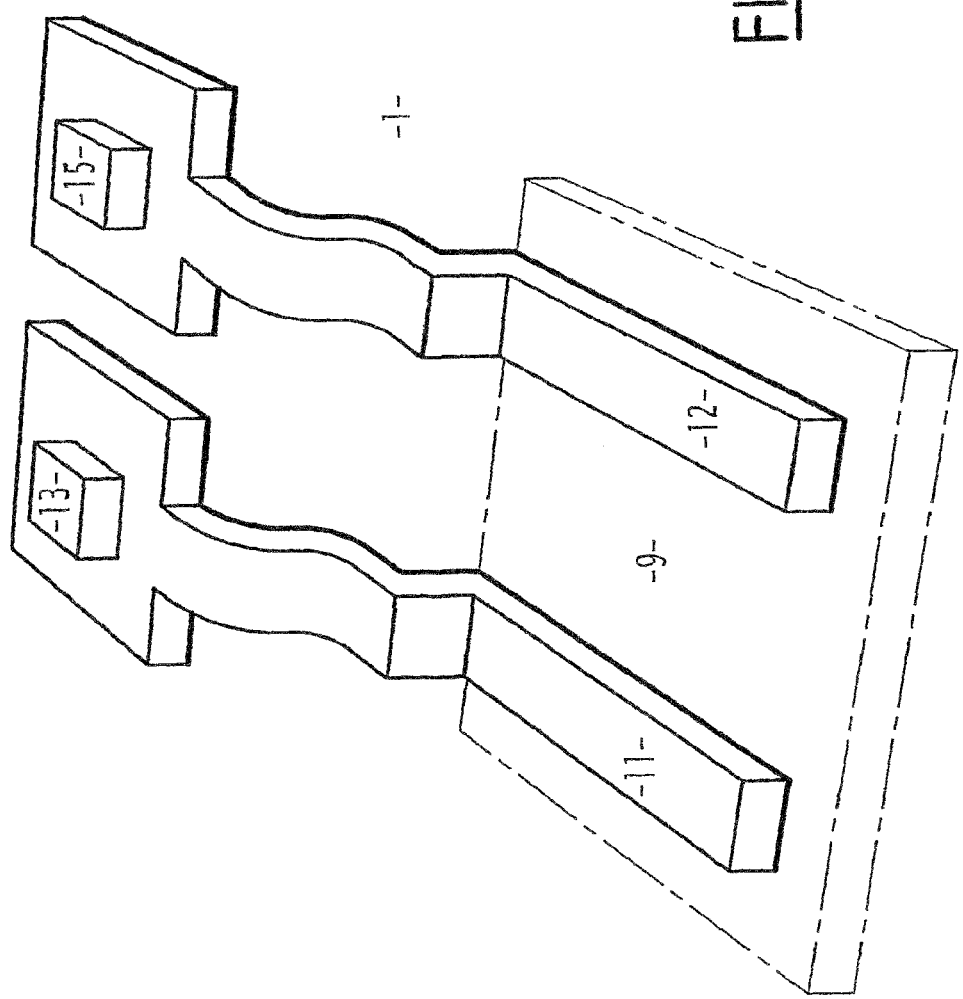
FIG. 11 is a perspective view of an IGFET in accordance with another embodiment of the invention.

For illustrative purposes, the stack of contacts and metal layers has been represented on top of each other above the transistor active area. However, some design rules for specific technologies forbid the implementation of a contact, or a via, directly above the polysilicon gate. The person skilled in the art understands that the shift of the contacts used to create the active and dummy gates outside the active area will not modify the operation of the transistor. Such an implementation is illustrated in FIG. 11. In the FIG. 11, only the polysilicon layers 11, 12 and the first contacts 13, 15 on top of the gate oxide 9 and the field oxide 1 are shown with an objective of clarity.

The person skilled in the art understands that the figures were drawn to illustrate the different embodiments and are not representative of the real dimension of the transistors or of the specificity of a particular technology. For instance, the gate oxide 9 of FIG. 1 could be limited to the area under the gate polysilicon without modifying the operation of the transistor.

The description is illustrative of the invention and is not to be construed as limiting the invention. Various modifications and applications may occur to those skilled in the art without departing from the invention as defined in the claims.

What is claimed is:

1. An IGFET device comprising:
    a substrate;
        two field oxide regions defined in the substrate and defining a device region therebetween;
        a source region defined in the substrate within the device region;
        a drain region also defined in the substrate within the device region and spaced from the source region by a channel region;
        a first dielectric layer disposed on the substrate within a span of the device region;
        an active gate insulated from the channel region by the first dielectric layer;
        a dummy gate disposed on the first dielectric layer; and
        a second dielectric material insulating the active gate from the dummy gate, the second dielectric material completely covering an entire top surface of the dummy gate, and the second dielectric material including an opening disposed therethrough to the active gate, the second dielectric material extending uninterrupted from the active gate to the dummy gate; and wherein the dummy gate, the active gate, and the second dielectric material disposed therebetween define a capacitor.

2. The IGFET device of claim 1 wherein the active gate and the dummy gate each comprise a stack of the same conductive layers.

3. The IGFET device of claim 1 wherein the dummy gate is disposed over the channel region.

4. The IGFET device of claim 1 wherein the dummy gate is disposed over the drain region.

5. The IGFET device of claim 4 wherein the drain region comprises a highly doped region of a first conductivity type located in contact with a low doped region of the first conductivity type.

6. The IGFET device of claim 5 wherein the dummy gate is disposed over the low doped region of the drain region.

7. The IGFET device of claim 1 wherein a first portion of the first dielectric layer insulates the active gate from the channel region and a second portion of the first dielectric layer insulates the dummy gate from the channel region and the first and second portions are disjoined.

* * * * *